United States Patent [19]
Rostoker et al.

[11] Patent Number: 5,625,563
[45] Date of Patent: Apr. 29, 1997

[54] METHOD AND SYSTEM FOR REDUCING THE NUMBER OF CONNECTIONS BETWEEN A PLURALITY OF SEMICONDUCTOR DEVICES

[75] Inventors: Michael D. Rostoker, Boulder Creek; Scott A. Macomber, Los Altos Hills, both of Calif.

[73] Assignee: LSI Logic Corporation, Milpitas

[21] Appl. No.: 370,210

[22] Filed: Jan. 9, 1995

[51] Int. Cl.$^6$ ................................................. H04L 29/08
[52] U.S. Cl. ........................ 364/488; 364/490; 340/825.5
[58] Field of Search .................... 364/200, 488, 364/489, 490, 491; 455/608; 340/825, 825.5; 324/312; 383/88; 359/152; 370/112, 77, 56; 395/200.01

[56] References Cited

U.S. PATENT DOCUMENTS

| | | | |
|---|---|---|---|
| 4,276,656 | 6/1981 | Petryk, Jr. | 455/608 |
| 4,509,121 | 4/1985 | Rey et al. | 364/200 |
| 4,717,914 | 1/1988 | Scott | 340/825 |
| 4,739,323 | 4/1988 | Miesterfeld et al. | 340/825.5 |
| 4,885,538 | 12/1989 | Hoenniger, III et al. | 324/312 |
| 5,039,194 | 8/1991 | Block et al. | 383/88 |
| 5,060,303 | 10/1991 | Wilmoth | 359/152 |
| 5,069,522 | 12/1991 | Block et al. | 385/39 |
| 5,079,770 | 1/1992 | Scott | 370/112 |
| 5,124,980 | 6/1992 | Maki | 370/77 |
| 5,222,062 | 6/1993 | Sharma et al. | 370/56 |
| 5,353,334 | 10/1994 | O'Sullivan | 379/59 |
| 5,452,419 | 9/1995 | Di Giulio et al. | 395/200.01 |

OTHER PUBLICATIONS

"A General-Purpose Link Interface Chipset for Gigabit Rate Data Communication", by Yen et al., Globecom '92: IEEE Global Telecommunications Conference, 1992, pp. 197–200.

"Design and Simulation of a Serial-Link Interconnection Network for a Massively Parallel Computer System", by Sharif et al., IEEE, MASCOTS '94: Modeling, Analysis, and Simulation Int'l. Workshop, Jun. 1994, pp. 115–119.

"Distributed Multiplexers for an ROV Control and Data System", by Mellinger et al., IEEE, Oceans '94, 1994, pp. I-584—I-589.

Primary Examiner—Kevin J. Teska
Assistant Examiner—Russell W. Frejd
Attorney, Agent, or Firm—Katz & Cotton, LLP

[57] ABSTRACT

Serial high speed interconnect devices are integrated with semiconductor devices to reduce the number of input-output pins required for communications and control between a plurality of semiconductor devices. The serial high speed interconnect devices transfer the data serially at a rate fast enough to replace large parallel data and address buses that require one conductive path per bit of data. Eliminating large parallel data and address buses allows the integrated circuit assembly containing the semiconductor device to be smaller, simpler and lower in cost. The subsequent reduction in the size of the integrated circuits improves the layout density of electronic systems and reduces crosstalk and other undesirable signal transfer anomalies. The serial high speed interconnection devices are implemented with a low cost serial interface logic technology that may be easily implemented on a semiconductor die in conjunction with the main logic circuits.

5 Claims, 8 Drawing Sheets

FIG. 8 ical and military applications...

METHOD AND SYSTEM FOR REDUCING THE NUMBER OF CONNECTIONS BETWEEN A PLURALITY OF SEMICONDUCTOR DEVICES

CROSS REFERENCE TO RELATED PATENT APPLICATIONS

This patent application is related to U.S. Ser. Nos. 370,539; 370,172; 370,434; 370,527; 370,286 and 370,261, filed, Jan. 9, 1995, concurrently herewith, and which are entitled "Method and System for Interconnecting Entertainment Systems Utilizing Bidirectional Digital Serial Communications Links," "Method and System for Interconnecting Remotely Located Display Devices to a Computer or the Like," "Method and System for Communicating Between a Plurality of Semiconductor Devices," "Method and System for Communicating Between a Plurality of Cores on a Semiconductor Device," "Computer Network Communications Interface Method and Apparatus," and "High-Speed Serial Random Access Memory Device," respectively, all by Michael D. Rostoker and Scott A. Macomber, and which are hereby incorporated by reference.

BACKGROUND OF THE INVENTION

1. Field of Invention

This invention relates to interconnection of digital integrated circuits and, more particularly, to reducing the number of input/output pins needed for communications and control between a plurality of digital integrated circuits.

2. Discussion of the Related Art

Semiconductor devices such as, for example, integrated circuits have revolutionized the field of electronics by making possible a level of technological sophistication unknown in the days of vacuum tubes and even discrete transistors. An integrated circuit die may comprise, on a small silicon chip, many thousand or even a million or more transistors interconnected together to form complex electronic functions. The complex electronic functions of the integrated circuit chip may require hundreds of external connections to a related electronic system.

Increases in electronic system performance, and the requirement to run complex computer software programs with a corresponding increase in memory requirements have dramatically increased the data throughput or "bandwidth" requirements of, for example, a computer system's memory and especially logic functions. At the same time, improvements in silicon integrated circuit technology have made it possible to integrate more and more logic functions onto a single integrated circuit chip. The advancements in technology and the corresponding utilization thereof have created the need for integrated circuit packages having input/output ("I/O") capacity requirements of over 500 external connections.

Simple function integrated circuits have been packaged in ceramic packages for high reliability industrial and military applications and in lower cost molded plastic packages for commercial and consumer products. Recently, very large scale integration (VLSI), ultra large scale integration ("ULSI"), and the like integrated circuits ("IC") have outgrown the connection capacity of either the ceramic or molded plastic packaging systems because of the large number of external connections required.

The IC packaging industry has therefore developed more sophisticated IC packages to accommodate the increased number of external connections required to be made to the associated electronic system. These IC packages, however, are expensive, difficult to fabricate, may require expensive sockets and take up a lot of valuable electronic system circuit board area. In addition, IC packaging technology has not been able to keep up with the rapidly increasing complexity and sophistication of integrated circuit technologies. This lag in IC packaging technology has limited the ability of the electronic circuit designer to utilize the full capabilities of present and future IC technologies in an easy to implement and cost effective way.

Another problem with IC packaging is the close proximity in spacing of signal connections that carry parallel data signals. Typically, parallel data signals may be digital words having 32, 64, 128 or more bits, and be connected to a parallel data bus having an equal number of conductive lands or wires such as a computer back plane or the like. The close proximity of many parallel signals having to drive a capacitive bus that may not be impedance matched creates signal crosstalk. Signal crosstalk further restricts the effective data rate and number of digital devices that may be effectively interconnected in an electronic system.

Yet another problem is connecting these parallel high bit capacity buses to the IC packages and then routing the physically wide parallel buses between the various IC packages on the electronic system substrate or printed circuit board. Sockets for the IC packages and connectors for peripheral printed circuit boards are expensive because of the large number of connections required. Similarly, leaded IC packages such as, for example, tape quad flat pack ("TQFP"), plastic quad flat pack ("PQFP"), and ball grid array ("BGA") packages require expensive equipment and complex procedures to accurately align the leads/balls on the substrate or board conductive land pattern.

As used herein, the term "semiconductor device" refers to a silicon chip or die containing electronic circuitry and is more commonly referred to as a "semiconductor integrated circuit" or "integrated circuit." The term "semiconductor device assembly" or "integrated circuit assembly" refers to the silicon die and associated packaging containing the die, including conductive leads, such as ball bump, pins, surface mount gull wing and J leads, conductive tabs or balls at the periphery of a package and/or on the interior of a surface or the like, for connecting to a system circuit board, and internal connections of the die to the conductive leads such as bond wires or tape automated bonding ("TAB"). The term "semiconductor device assembly" or "integrated circuit assembly" may also refer to the silicon die and associated leadframe such as a tape carrier or package-less silicon die on a leadframe which may be encapsulated or not. The leadframe is connected to the package-less silicon die as is well known to those skilled in the art of semiconductor devices.

What is needed is a method and system for reducing the required number of input-output pins necessary for communicating between complex integrated circuits that require high data throughput and are contained in simple and inexpensive integrated circuit assemblies.

SUMMARY OF THE INVENTION

It is therefore an object of the present invention to provide a method and system for reducing the required number of input-output pins necessary for communicating between complex integrated circuits that require high data throughput.

It is a further object to reduce the packaging and pin-out complexity of an integrated circuit.

Yet another object is to implement a digital serial interface in an integrated circuit.

Still another object is to implement a scalable digital serial interface in a semiconductor integrated circuit.

Yet another object is to implement a dormant digital serial interface in a semiconductor integrated circuit for activation by a hardware enable signal or software program command.

A further object is to implement a simple serial interface in a semiconductor integrated circuit.

Another object is a scalable digital serial interface having reserve data transmission capacity for future increases in the mount of data transferred.

According to the present invention, a semiconductor integrated circuit incorporates a high speed digital serial communications and control interface. This serial interface transmits and receives digital information and control signals on a serial digital communications link that may be communicated over, for example, coaxial cable, twisted pair, glass fiber optic light conduit, wireless such as cellular, VHF and UHF radio, microwave or focused infrared.

The present invention eliminates the need for complex multi-wire digital buses presently needed to interconnect high speed digital information between integrated circuit devices containing the various complex and high speed semiconductor devices. The heretofore parallel data buses have created the requirement for high pin count packages in order to transmit in parallel (simultaneous data transmission) the digital information. In addition, routing of these parallel data buses on the system printed circuit board is difficult and requires a significant amount of circuit board area.

According to an aspect of the invention, serial high speed interconnect devices may be implemented from any number of existing technologies that are being presently utilized for sending and receiving high speed digital computer data. Typical digital protocols are well known to those skilled in the art of digital communication systems as may be utilized for data modems, local area networks ("LAN"), wide area networks ("WAN"), and the like (both "wired" and "wireless" configurations).

An illustrative serial transmission technology is disclosed in U.S. Pat. No. 5,268,937, entitled "Method and System for Digital Transmission of Serial Data," issued Dec. 7, 1993, by Roland Marbot; and U.S. Pat. No. 5,260,608, entitled "Phase-Locked Loop and Resulting Frequency Multiplier," issued Nov. 9, 1993, by Roland Marbot; both incorporated by reference herein for all purposes (the "Marbot Patents").

The Marbot Patents teach a method and system for digital data transmission that also includes a means of creating all necessary clock and synchronization information for the data so as to constitute the transmission signal and determine the transmission speed, clock rate, and synchronization lock from the revived transmission signal. The circuits disclosed in the Marbot Patents may be integrated onto the semiconductor device or on another semiconductor device proximate to the IC device in the same semiconductor device assembly. Use of serial transmission and reception digital logic circuits requiring no analog phase lock loop subsystems helps make the present invention economically practical. In addition, a minimum of digital protocol overhead is required and digital communication between the various semiconductor devices is rapid and reliable.

Implementation of the circuits of the Marbot Patents, and other similar types of circuits, in the present invention is well known to those skilled in the art of digital communications systems and integrated circuit design. Integrated circuits utilizing the Marbot Patents or similar technologies are easily designed and preferably may be combined with the other digital circuits on the semiconductor integrated circuit.

Preferably, a serial digital transmission technology that may be utilized is SeriaLink™ (SERIALINK is a trademark of LSI Logic Corporation) circuits. The SERIALINK technology is owned by LSI Logic Corporation. This SERIALINK technology is more fully described in "SeriaLink SL300 High-Speed Serializer/Deserializer Technical Manual," LSI Logic Document DB04-000042-00, First Edition.

Both the Marbot Patents and SERIALINK technologies may be used to implement "serial high speed interconnect devices" ("SHSID"). The SHSID may be utilized with any number of data transmission protocols such as, for example, the Scalable Coherent Interface ("SCI"), ANSI/IEEE Std 1596-1992SCI, Asynchronous Transfer Mode ("ATM"), Fiber Channel, SerialBus, SCSI, SSA, QuickRing, HIPPI, FDDI, Ethernet and other present or future serial digital protocols. Many other alternative serial high-speed interconnection technologies may be used and are contemplated herein. The driving force in the implementation of the present invention is cost, reliability and ease of use.

A feature of the present invention is the simplicity in which the various semiconductor devices may be connected (bused) together. The serial link(s) of the present invention multiplex and serially transmit the various digital I/O signals so that a smaller number of interconnections are needed for transmission thereof. The multiplexed signals, according to an aspect of the present invention, may be serially transmitted at a very high data rate, for example, greater than one GigaHertz. This very high multiplexed data rate has sufficient information bandwidth to handle the majority of computational and data transfer intensive applications presently implemented in digital electronic systems. Where a higher data throughput is desired, the present invention is easily scalable up to the higher data throughput required by utilizing multiple serial links. Each serial link is capable of data rates of, for example, greater than one Gigabit per second ("GBS"). It is also a feature of the present invention that the serial link may be run at a slower data rate and "speeded up" for future applications by increasing the data transfer rate of the serial link by hardware and/or software control.

Physical serial link interconnections between the semiconductor devices may be made with constant impedance strip line, coaxial cable, twisted wire pair or the like. The semiconductor devices may be on one substrate or printed circuit beard or on a plurality of printed circuit beards. Alternatively, wireless interconnections may be accomplished between the semiconductor devices by using microwave, focused infrared, spread spectrum or other wireless data transmission systems.

Combinations of both wired and wireless connections are also contemplated. It is the intent of the present invention that cables, wires, twisted pairs and the like also include non-physical, i.e., wireless connections as is well known to those skilled in the art. The wireless communications medium may also be part of the semiconductor device assembly or fabricated onto the semiconductor integrated circuit.

A feature of the present invention is implementation of at least one high speed serial link in each semiconductor device. This serial link may initially remain dormant and not utilized until it is required in the electronic system. By implementing the serial link into each integrated circuit, the electrical designer may choose to interconnect but not utilize the high speed data serial link until required in the system, i.e., future system upgrade or expansion.

Having the serial link(s) remain dormant until needed allows using ICs in existing parallel bus systems and then being able to easily upgrade system performance by simply enabling the serial link(s) which already exist in the ICs of the present invention. Thus, existing equipment designs need not be made obsolete. In addition, new designs utilizing the serial link(s) of the present invention may be integrated into normal product design updates and will be ready for full implementation of the serial link(s) when appropriate. This also facilitates reduction in manufacturing costs by allowing the use of lower cost IC packages and interconnecting these reduced cost IC packages with serial link(s) of the present invention.

The selection, combination and interplay between the semiconductor devices and their relative locations is greatly expanded because, with the present invention, the designer is not required to rely on a plurality of individual signal wires in a parallel bus configuration that has to be correctly interconnected between the semiconductor devices. The semiconductor devices no longer must be in close proximity to one another on the same system printed circuit board, or closely coupled system and daughter boards.

Other objects, features and advantages of the invention will become apparent in light of the following description thereof when taken in combination with the drawings.

DETAILED DESCRIPTION OF THE INVENTION

Figure 1:
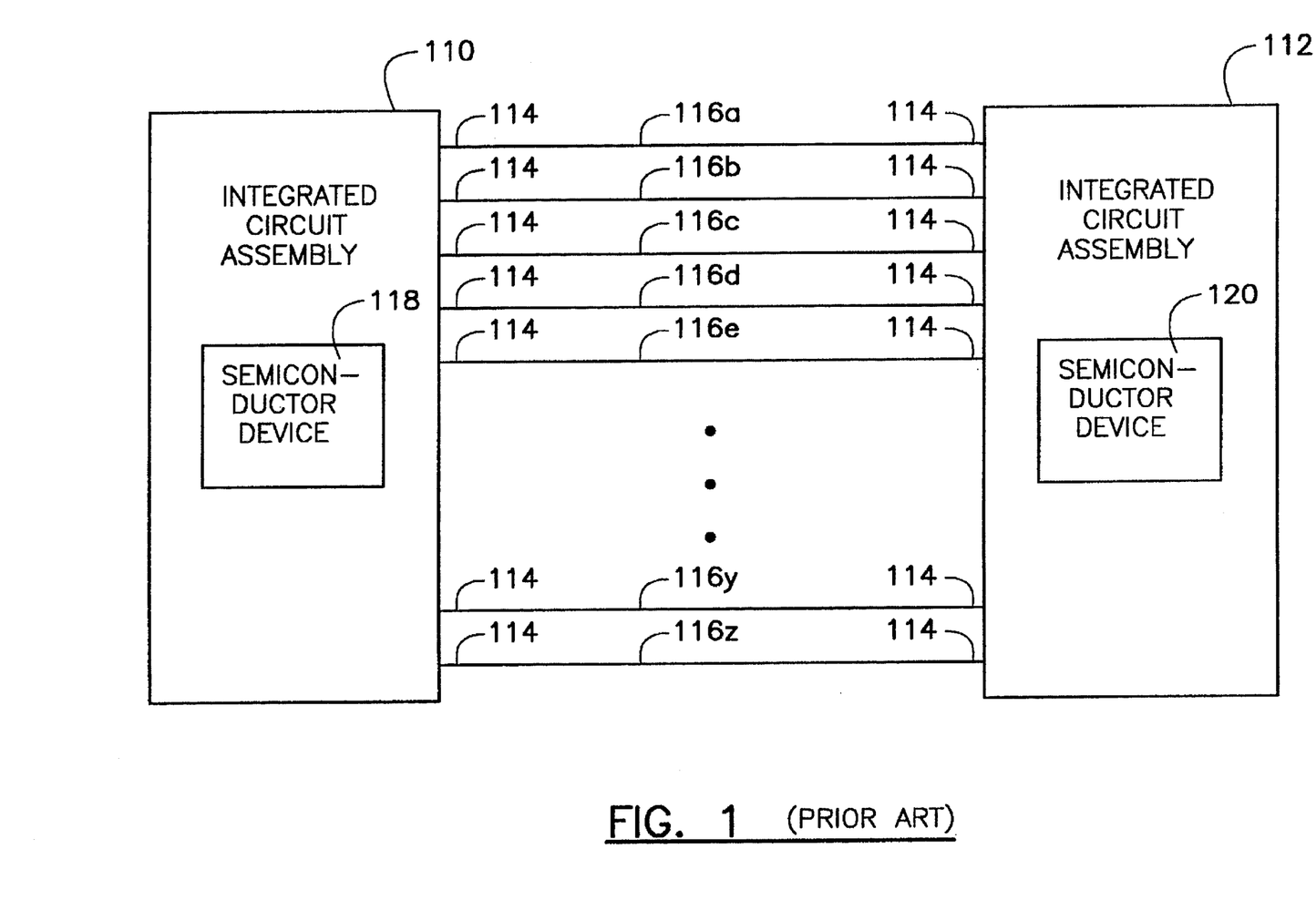
FIG. 1 is a schematic block diagram of a prior art interconnection of two integrated circuit assemblies.

FIG. 1 illustrates two integrated circuit assemblies connected together by a parallel bus comprising a plurality of wires, or conductive traces on a substrate or printed circuit board. Integrated circuit assemblies 110 and 112 contain semiconductor devices 118 and 120, respectively. A parallel bus 116 consists of a plurality of bus conductors 116a–116z. Bus/conductors 116a–116z each carry one signal bit of information between the integrated circuit assemblies 110 and 112. The bus/conductors 116a–116z connect to the integrated circuit assemblies 110 and 112 at external connections 114.

The interconnection of the two integrated circuit assemblies 110 and 112 illustrated in FIG. 1 is representative of present technology digital logic systems that must process large mounts of digital data. The system of FIG. 1 handles the digital data as parallel digital words. These words may be 8, 16, 24, 32, 64, 128, 256, etc. bits wide. As is well known to those skilled in the art of digital circuits, parallel signal connections require integrated circuit assemblies having a large number of external connections such as, for example, 500 pins or solder balls (pin grid array or ball grid array).

A large number of connections on an integrated circuit assembly requires complex and expensive packaging techniques. In addition, semiconductor devices are continually being designed to operate at increasingly faster speeds. The large number of conductors and fast data rates creates the problem of signal crosstalk which limits the information transfer rate between integrated circuit assemblies and the number of assemblies that may be connected together.

Figure 2:
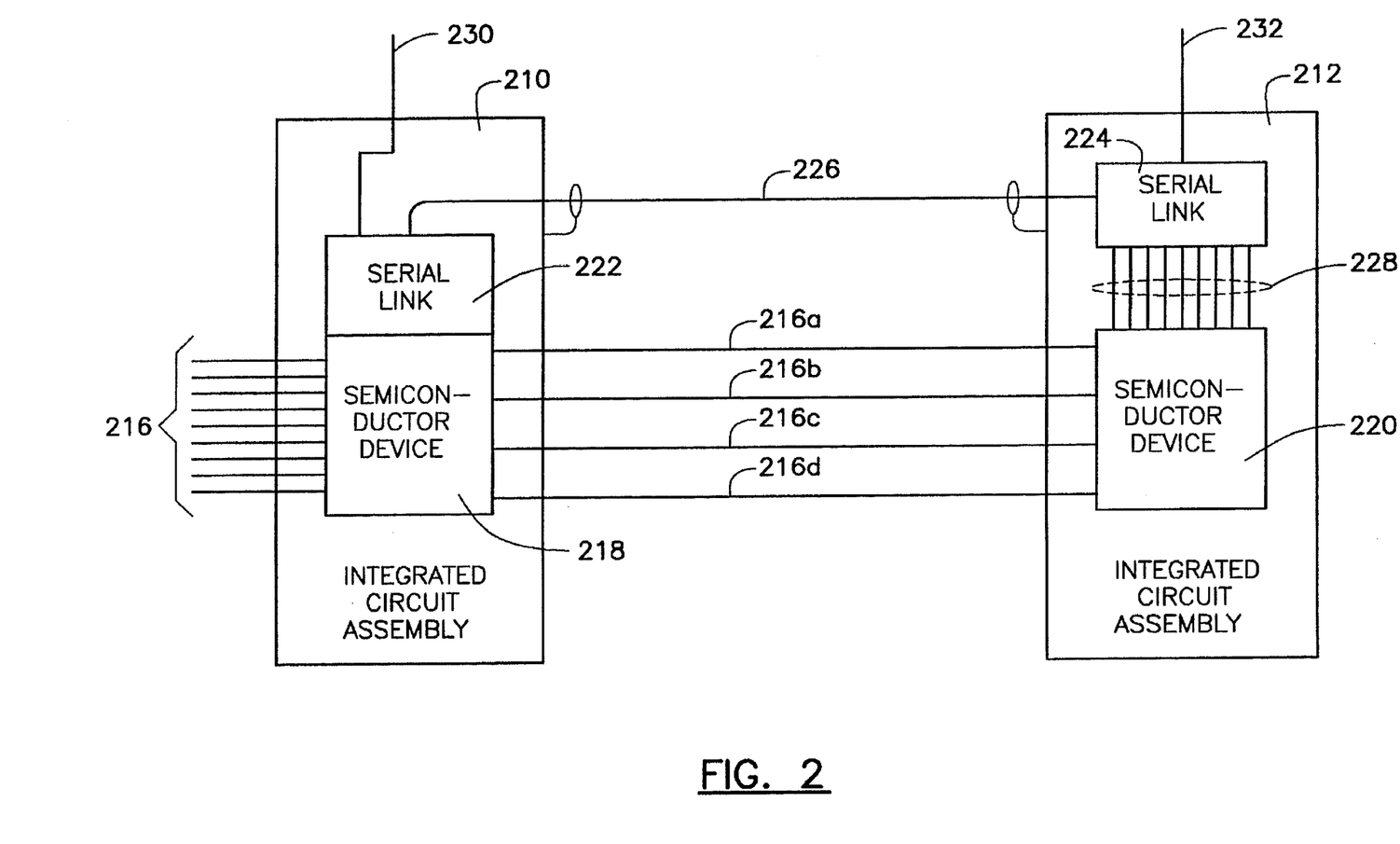
FIG. 2 is a schematic block diagram of a preferred embodiment of the present invention.

Referring now to FIG. 2, a schematic block diagram of the system and method of the present invention is illustrated. Integrated circuit assemblies 210 and 212 contain semiconductor devices 218 and 220, and serial links 222 and 224, respectively. Serial link 224 and semiconductor device 220 are individual semiconductor devices in the assembly 212. Serial link 224 and device 220 may be connected together by interconnections 228 such as, for example, bond wires, TAB, or other means well known to those skilled in the art of interconnecting semiconductor devices. Serial link 222 and semiconductor device 218 may be fabricated on the same semiconductor die and interconnection therebetween may consist of conductive metal patterns as is well known to those skilled in the art of semiconductor integrated circuit fabrication.

Bus 216 may connect the integrated circuit assemblies 210 and 212 together and to other circuits in an electronic system. The bus 216 consists of a plurality of conductors 216a–216d, each of which conducts a single bit of data. As mentioned above, present day semiconductor devices require a large number of conductors, and thus require a large number of connections associated with the semiconductor device package (integrated circuit assembly).

It is an object of the present invention to interconnect complex integrated circuits that require high data throughput, and to substantially reduce the number of external connections required. The present invention utilizes high speed serial interconnects such as SHSIDs between integrated circuit assemblies. The SHSID may be the aforementioned Marbot Patent or SeriaLink technologies, or any SHSID that is inexpensive and easy to implement in an integrated circuit assembly or on a semiconductor device.

A serial high speed interconnect 226 is utilized to interconnect the serial links 222 and 224, effectively allowing high speed serial data transfer between the semiconductor devices 218 and 220 without requiring a large number of bus/conductors 216. The system illustrated in FIG. 2 may utilize both SHSID and parallel bus technologies. The bus/conductors 216 is available for interconnection with electronic devices not having an SHSID. In addition, integrated circuit assemblies 210 and 212 may be fabricated with built-in SHSIDs that are internally connected to the semiconductor devices 218 and 220, respectively.

Serial link enables 230 and 232 may be used to enable or disable the serial links 222 and 224, respectively. This allows an integrated circuit assembly to be fabricated with an SHSID, then to be integrated into a electronic system, and when appropriate, to have the SHSID activated thus enabling high speed data transfer. The activation of the SHSID may also be by software control.

A mixture of data transfers by both the parallel bus/ conductors 216 and serial high speed link interconnect 226 are anticipated. It is anticipated that utilizing at least one SHSID integrated with complex digital semiconductor devices such as, for example, random access memory ("RAM"), central processing unit ("CPU"), arithmetic logic unit ("ALU"), disk controller, video controller, digital signal processing ("DSP"), and the like, will enable these complex devices to be packaged in low cost and simple to fabricate integrated circuits. The savings in semiconductor device packaging and electronic system fabrication costs will be significant. In addition, the area required on a system substrate (printed circuit board) will be reduced because the integrated circuit assemblies will be much smaller than present technology integrated circuit assemblies.

SHSIDs may be effectively utilized with high speed digital circuits because the SHSID is capable of one GBS or greater data rates. When greater data throughput rates are desired, a plurality of SHSIDs may be utilized.

Figure 3:
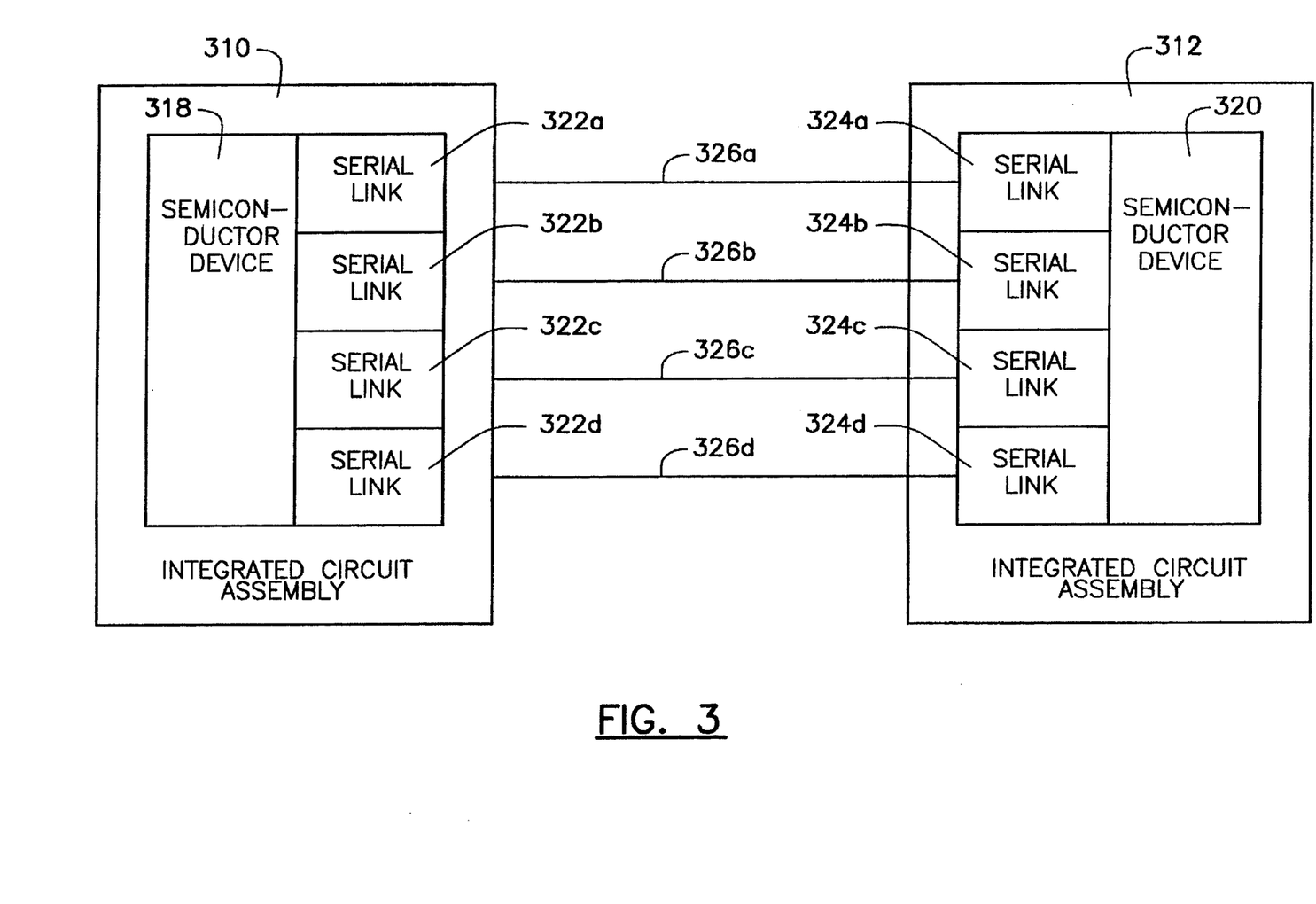
FIG. 3 is a schematic block diagram of an embodiment of the present invention having a plurality of serial high speed interconnect devices.

Referring to FIG. 3, a schematic block diagram of an embodiment of the present invention having a plurality of SHSIDs is illustrated. Semiconductor devices 318 and 320 may have serial links 322a–322d and 324a–324d, respectively, integrated on the semiconductor device die. Interconnection of all data and control signals between the digital circuits of the semiconductor device and the serial link may be accomplished with conductive layers of deposited metal as is well known to those skilled in the art of semiconductor integrated circuit fabrication.

Each serial high speed interconnect 326a–326d may carry a portion of the data needed to be transferred between integrated circuit assemblies 310 and 312. It is contemplated that more than one serial high speed interconnect 326 may be so utilized. The number of serial high speed interconnects 326 is only limited by the size and complexity of the integrated circuit assembly and semiconductor device.

Another embodiment contemplated is the serial links 322a–322d and 324a–324d having a dormant mode wherein the interconnects 326a–326d may be initially parallel data lines each carrying one bit of information in a parallel data bus. Serial link enables 330 and 332 are used to enable and disable the serial links 322a–322d and 324a–324d, respectively. When the serial links are disabled, each interconnect 326a–326d carries only one bit of information. When the serial links are enabled, the present invention may use one or more of the interconnects 326a–326d to transfer data at a high speed serial rate.

Figure 4:
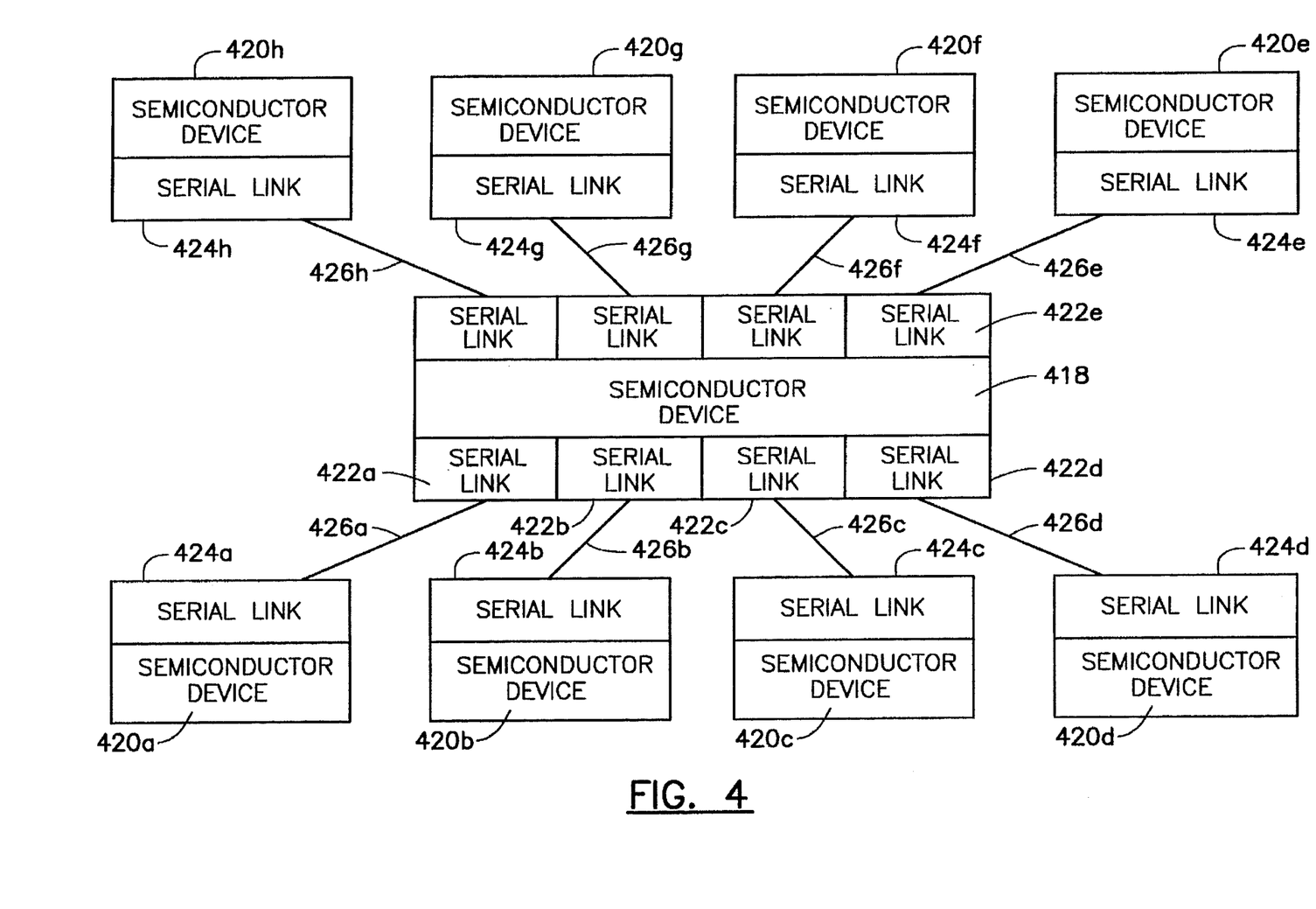
FIG. 4 is a schematic block diagram of the present invention interconnected in a star configuration.

Referring now to FIG. 4, a schematic block diagram of a plurality of semiconductor devices having serial link interconnections in a radial or "star" configuration is illustrated. A central or master semiconductor device 418 has a plurality of serial links 422a–422h. The serial links 422a–422h connect the master semiconductor device 418 to a plurality of semiconductor devices 420a–420h each having a serial link 424a–424h, respectively. A serial link and semiconductor device may be fabricated on the same semiconductor integrated circuit die or may be fabricated on separate dice and interconnected inside an integrated circuit assembly (see FIGS. 2 and 3).

The electronic system illustrated in FIG. 4 may be a computer system wherein the master semiconductor device 418 may be the computer CPU and the semiconductor devices 420a–420h may be, for example, RAM, video RAM, disk controller, optical disk controller, speech synthesis, speech recognition, telecommunications, digital video processor, arithmetic logic co-processor, built-in test equipment ("BITE") and the like.

The integrated circuit assembly packaging (not illustrated in FIG. 4) required for the master semiconductor device 418 and semiconductor devices 420a–420h would be of minimal size and pin out, just large enough to encapsulate the semiconductor devices 418 and 420, and serial link devices 422 and 424. The external connection pins required would be minimal. The only pins necessary are power and ground (not illustrated), connections for serial high speed interconnections 426a–426h and, optionally, control and test functions (not illustrated). A great deal of electronic system substrate or printed circuit board space is saved by the reduced size of the integrated circuit assemblies, and the reduction in printed circuit board area presently required for running large multiple conductor parallel data and address buses.

Another advantage is that the serial high speed interconnect may be designed using microwave techniques such as utilization of constant impedance strip lines and improved shielding to minimize crosstalk. Also, because the integrated circuits of the present invention may be located closer together, propagation delays of the high speed serial data signals may be reduced.

Figure 5:
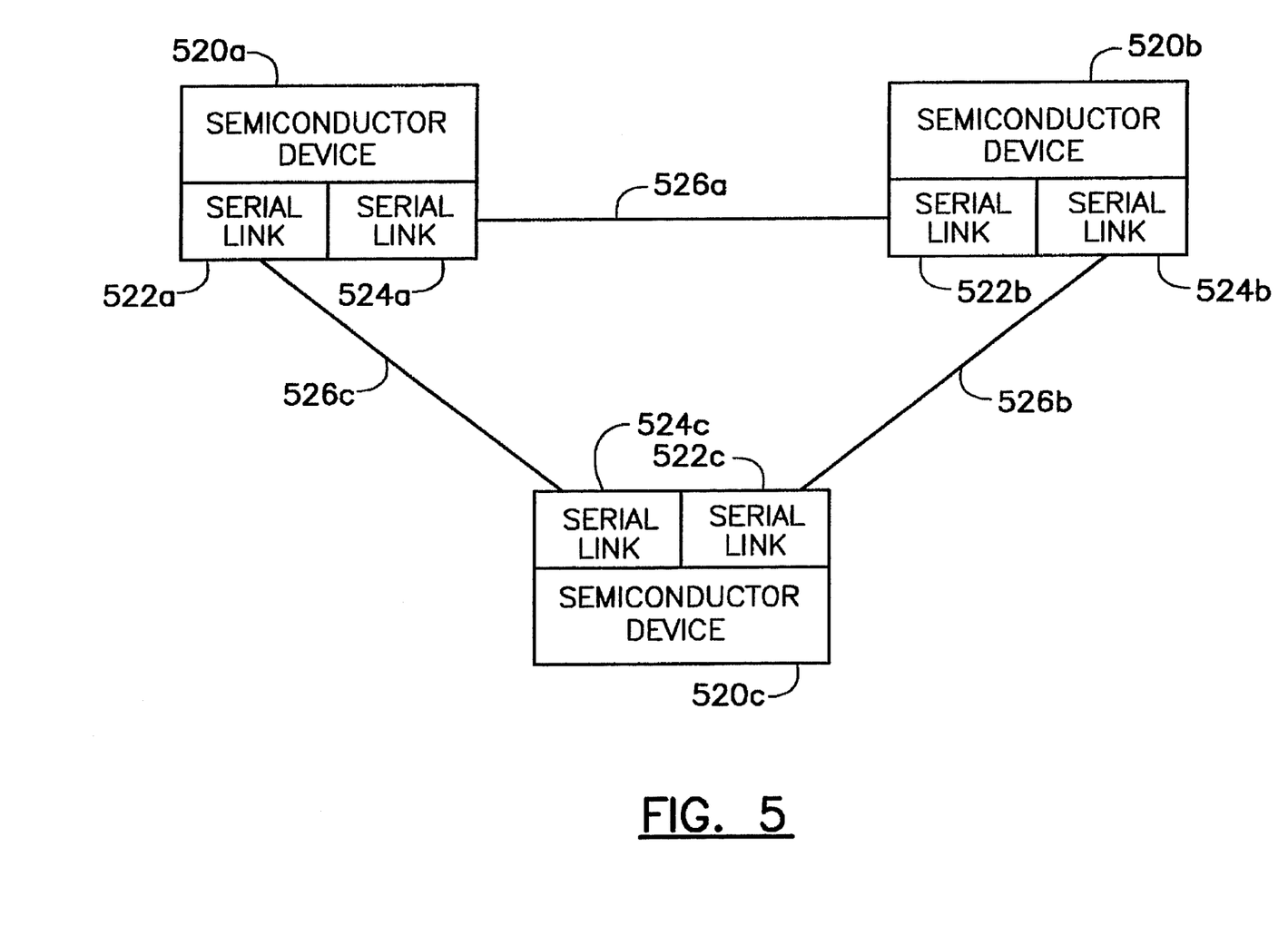
FIG. 5 is a schematic block diagram of the present invention interconnected in a ring configuration.

FIG. 5 illustrates a schematic block diagram of another embodiment of the present invention wherein the serial links are connected in a ring configuration. Semiconductor devices 520a–520c are connected to serial links 522a–522c and 524a–524c, respectively. Serial links 524a and 522b, serial links 524b and 522c, and serial links 524c and 522a connect together over serial high speed interconnects 526a, 526b and 526c, respectively. Digital data may pass through each serial link and/or be processed in the respective semiconductor device.

An advantage of the present invention, as illustrated in FIG. 5 is the simplicity in configuration and ease in connection of the integrated circuits in an electronic system. No special layout is required and minimum propagation delay is achieved because of the close proximity of the assemblies. Terminated and matched high speed serial interconnects may be easily implemented on the system substrate to reduce signal crosstalk and noise that degrades system performance and limits maximum data throughput.

Figure 6:
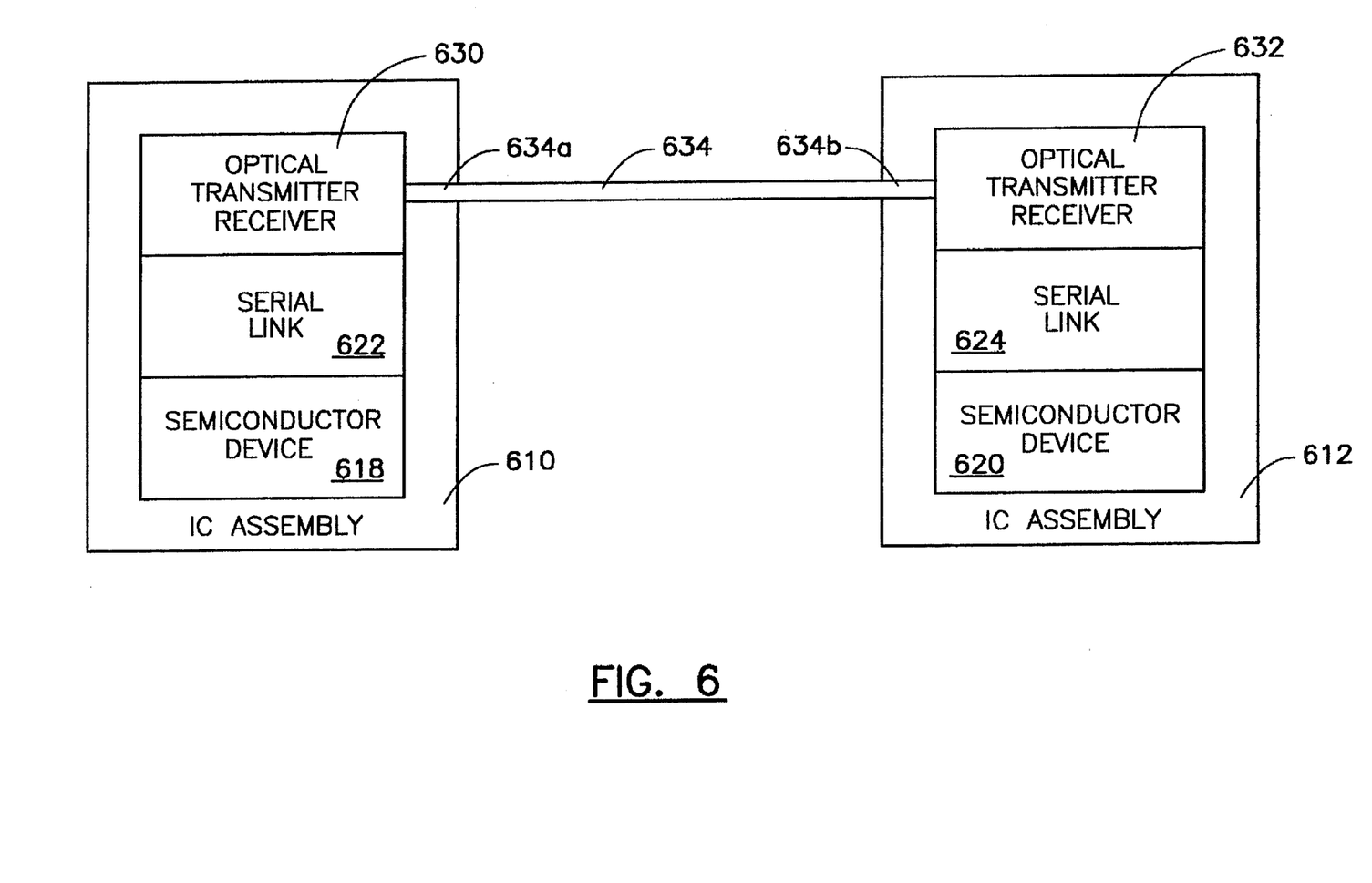
FIG. 6 is a schematic block diagram of a fiber optic interconnection of the present invention.

Referring now to FIG. 6, a schematic block diagram of an embodiment of the present invention utilizing a fiber optic serial link is illustrated. Integrated circuit assembly 610 comprises a semiconductor device 618, a serial link 622, an optical transmitter/receiver 630 and a fiber optic connection 634a for a fiber optic interconnection 634. Integrated circuit assembly 612 comprises a semiconductor device 620, a serial link 624, an optical transmitter/receiver 632 and a fiber optic connection 634b for the fiber optic interconnection 634. The fiber optic interconnection 634 conveys light signals between the optical transmitters/receivers 630 and 632.

The optical transmitters/receivers 630 and 632 are connected to the serial links 622 and 624, respectively, and convert the high speed digital signals into photo optic light pulses. These photo optic light pulses are highly immune to electrical noise and may be transmitted over great distances as is well known to those skilled in the digital communications arts. The fiber optic interconnection 634 allows the assemblies 610 and 612 to be located on the same system substrate, on different system substrates, or in different systems.

Figure 7:
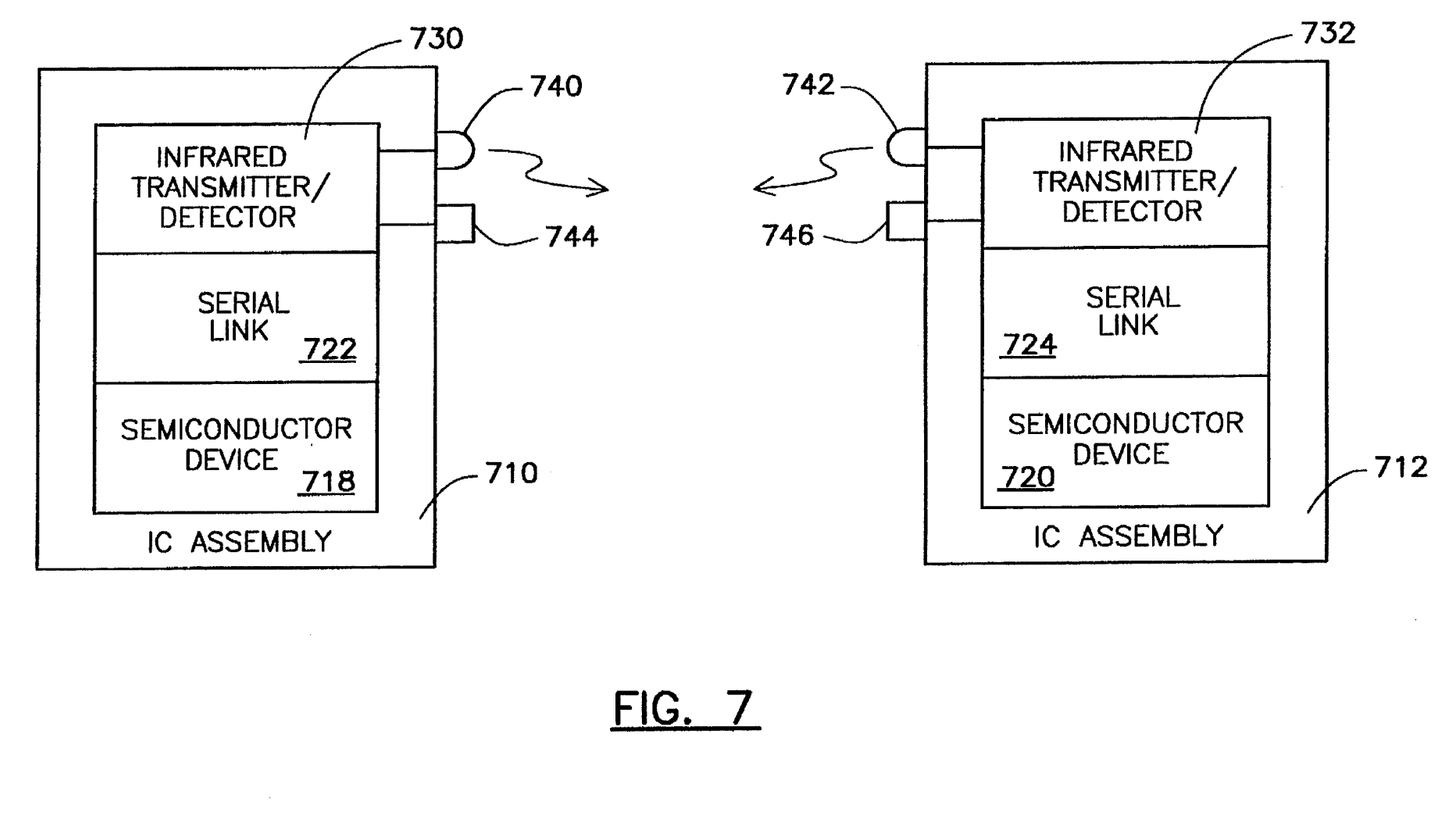
FIG. 7 is a schematic block diagram of an infrared interconnection of the present invention.

Referring now to FIG. 7, a schematic block diagram of an embodiment of the present invention utilizing a focused infrared light is illustrated. Integrated circuit assembly 710 comprises a semiconductor device 718, a serial link 722, an infrared transmitter/receiver 730, a focused infrared light emitting diode 740 and an infrared sensitive photocell 744. Integrated circuit assembly 712 comprises a semiconductor device 720, a serial link 724, an infrared transmitter/receiver 732, a focused infrared light emitting diode 742 and an infrared sensitive photocell 746.

Focused infrared light pulses are emitted from the focused infrared light emitting diodes 740 and 742, and detected by the infrared sensitive photocells 744 and 746, respectively. The infrared transmitter drives the light emitting diode and the infrared detector receives signal pulses from the photocell. The assemblies 710 and 712 may be located on the same system substrate, on different system substrates, or in different systems so long as they are both in optical sight of one another.

Figure 8:
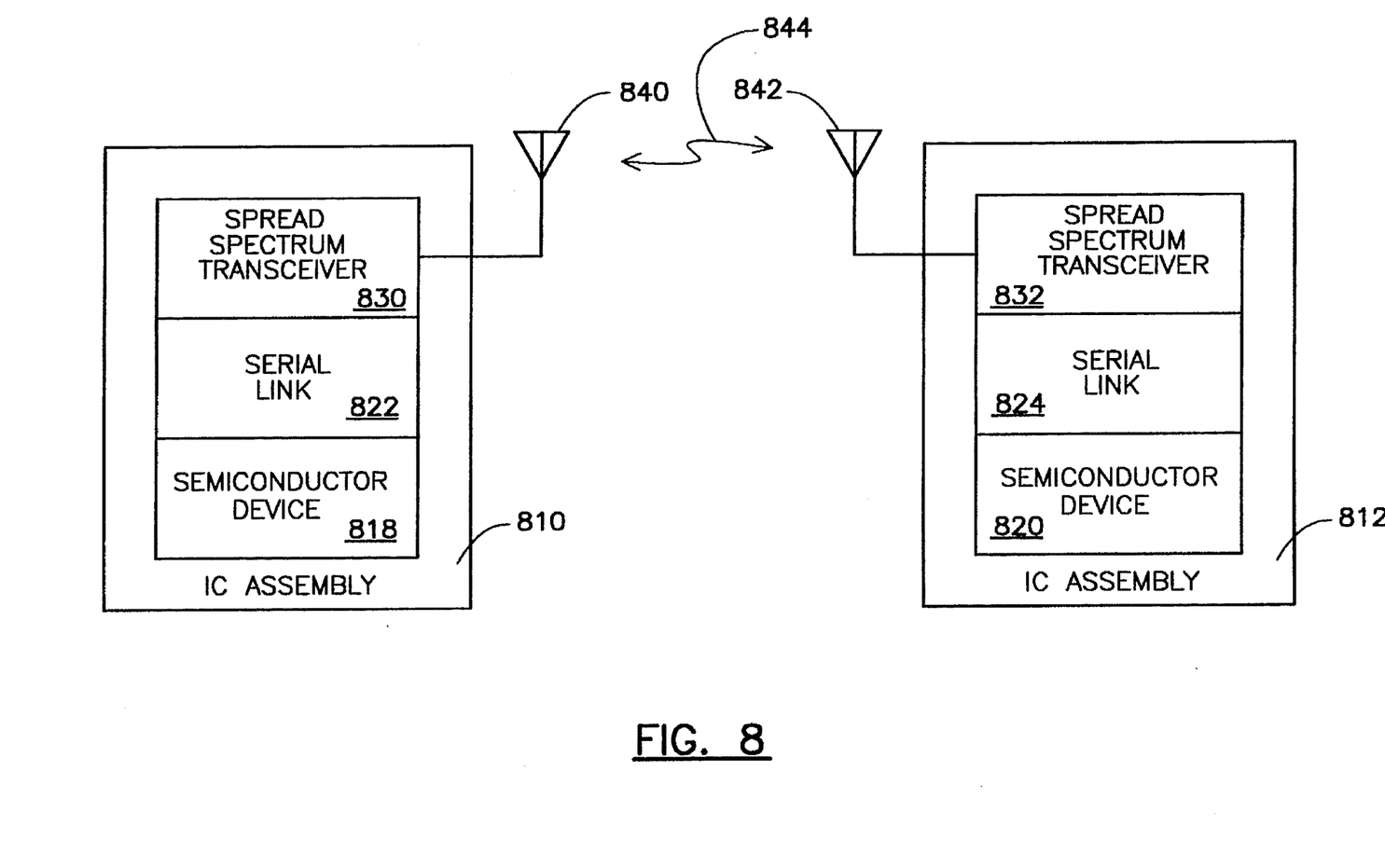
FIG. 8 is a schematic block diagram of a radio frequency spread spectrum interconnection of the present invention.

FIG. 8 illustrates a schematic block diagram of an embodiment of the present invention utilizing spread spectrum radio waves for transferring the high speed serial data between the integrated circuit assemblies. Integrated circuit assembly 810 comprises a semiconductor device 818, a serial link 822, a spread spectrum transmitter/receiver ("transceiver") 830, and an antenna 840. Integrated circuit assembly 812 comprises a semiconductor device 820, a serial link 824, a spread spectrum transceiver 832, and an antenna 842. Spread spectrum radio waves 844 convey the high speed serial digital information between the transceivers 830 and 832. The assemblies 810 and 812 may be located on the same system substrate, on different system substrates, or in different systems so long as they are both within radio signal range of one another.

The embodiments of the present invention illustrated in FIGS. 7 and 8 utilize "wireless" communications for the transfer of high speed serial data between assemblies. The number of methods for wireless transmission are only limited by the required bandwidth of the serial link. Any form of wireless communication may be utilized that has the necessary bandwidth for at least one GPS of digital data transmission, preferably in the microwave region. When bandwidth is limited, a plurality of serial links may be utilized (see FIG. 3) between assemblies.

The present invention introduces a new system and method of reducing the number of interconnections required between semiconductor integrated circuit assemblies, reduces the size and complexity of system substrates previously needed for highly parallel buses, and reduces the size and cost of packaging the semiconductor integrated circuit assembly.

The present invention, therefore, is well adapted to carry out the objects and attain the ends and advantages mentioned, as well as others inherent therein. While presently preferred embodiments of the invention have been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. A system for reducing the number of signal connections between a plurality of semiconductor device assemblies, comprising:

a first integrated circuit assembly containing a first semiconductor device and a plurality of first signal links, said first semiconductor device connected to said plurality of first signal links and said plurality of first signal links connected to a plurality of first signal connections on said first integrated circuit assembly;

a second integrated circuit assembly containing a second semiconductor device and a plurality of second signal links, said second semiconductor device connected to said plurality of second signal links and said plurality of second signal links connected to a plurality of second signal connections on said second integrated circuit assembly;

said plurality of first and second signal connections connected together by a plurality of signal interconnections, wherein digital data is transferred between said first and second integrated circuit assemblies over said plurality of signal interconnections; and a plurality of first and second signal link enables, each of said plurality of first and second enables activates each of said plurality of first and second signal links, respectively, wherein the enabled ones of said first and second signal links transfer high speed serial data and the disabled other ones of said first and second signal links transfers parallel data at one bit per disabled signal link.

2. The system of claim 1, wherein said signal interconnection is a constant impedance strip line.

3. The system of claim 1, wherein said signal interconnection is a coaxial cable.

4. The system of claim 1, wherein said signal interconnection is a twisted wire pair.

5. A semiconductor device assembly having a reduced number of signal connections, comprising:

a semiconductor device;

at least one signal link connected to said semiconductor device;

at least one signal link enable connected to said at least one signal link for enabling and disabling said at least one signal link, wherein said at least one signal link when enabled is capable of transferring high speed digital serial information and when disabled is capable of transferring only a single bit of parallel information; and said at least one signal link connected to at least one high speed signal interconnection.

* * * * *